United States Patent
Yang et al.

(10) Patent No.: US 11,094,245 B2
(45) Date of Patent: Aug. 17, 2021

(54) SHIFT REGISTER, DRIVING METHOD THEREOF, GATE DRIVING CIRCUIT AND DISPLAY DEVICE

(71) Applicants: HEFEI BOE OPTOELECTRONICS TECHNOLOGY CO., LTD., Hefei (CN); BOE TECHNOLOGY GROUP CO., LTD., Beijing (CN)

(72) Inventors: Qing Yang, Beijing (CN); Silin Feng, Beijing (CN)

(73) Assignees: HEFEI BOE OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 14 days.

(21) Appl. No.: 16/649,509

(22) PCT Filed: Sep. 20, 2019

(86) PCT No.: PCT/CN2019/106911
§ 371 (c)(1),
(2) Date: Mar. 20, 2020

(87) PCT Pub. No.: WO2020/093796
PCT Pub. Date: May 14, 2020

(65) Prior Publication Data
US 2021/0217350 A1    Jul. 15, 2021

(30) Foreign Application Priority Data
Nov. 6, 2018  (CN) .......................... 201811317635.9

(51) Int. Cl.
*G09G 3/20* (2006.01)
*G09G 3/3266* (2016.01)

(52) U.S. Cl.
CPC .... *G09G 3/2092* (2013.01); *G09G 2300/0426* (2013.01); *G09G 2310/0286* (2013.01); *G09G 2310/061* (2013.01); *G09G 2310/08* (2013.01)

(58) Field of Classification Search
CPC ....... G09G 2310/08; G09G 2300/0426; G09G 2310/061; G09G 3/2092; G09G 2310/0286; G09G 3/3266; G09G 3/3274; G11C 19/28
See application file for complete search history.

(56) References Cited

U.S. PATENT DOCUMENTS 6,345,085 B1    2/2002  Yeo et al.
2016/0125954 A1*  5/2016  Gu .................... G09G 3/3688
                                                         377/64
(Continued)

FOREIGN PATENT DOCUMENTS

CN    104064158 A    9/2014
CN    105161134 A    12/2015
(Continued)

*Primary Examiner* — Hong Zhou
(74) *Attorney, Agent, or Firm* — Kinney & Lange, P.A.

(57) ABSTRACT

Embodiments of the present disclosure propose a shift register, a driving method thereof, a gate driving circuit, and a display device. The shift register includes: an inputting sub-circuit, an outputting sub-circuit, a resetting sub-circuit, a pulling-down sub-circuit, a pulling-down controlling sub-circuit, and a voltage regulating sub-circuit. The voltage regulating sub-circuit is coupled to a pulling-down node, a pulling-down controlling node, a second clock signal terminal, a third clock signal terminal, a first voltage signal terminal and a second voltage signal terminal, and is configured to regulate a voltage at the pulling-down controlling node based on a first voltage signal from the first voltage signal terminal and a second voltage signal from the second voltage signal terminal, under a control of the second clock signal from the second clock signal terminal, a third clock (Continued)

signal from the third clock signal terminal, and the voltage at the pulling-down node.

18 Claims, 10 Drawing Sheets

(56) References Cited

U.S. PATENT DOCUMENTS

| | | | |
|---|---|---|---|
| 2016/0260403 A1 | 9/2016 | Dai | |
| 2017/0039968 A1* | 2/2017 | Chen | G09G 3/3677 |
| 2017/0287428 A1 | 10/2017 | Xue et al. | |
| 2017/0345515 A1 | 11/2017 | Shang | |
| 2017/0364170 A1* | 12/2017 | Gu | G09G 3/36 |
| 2018/0047327 A1 | 2/2018 | Wang | |
| 2018/0122315 A1 | 5/2018 | Zhang et al. | |
| 2018/0211606 A1* | 7/2018 | Zhang | G09G 3/36 |
| 2018/0226132 A1* | 8/2018 | Gao | G09G 3/3677 |
| 2019/0096350 A1 | 3/2019 | Zhao | |

FOREIGN PATENT DOCUMENTS

| | | | |
|---|---|---|---|
| CN | 105185345 A | 12/2015 | |
| CN | 105469738 A | 4/2016 | |
| CN | 106448539 A | 2/2017 | |
| CN | 107705762 A | 2/2018 | |
| CN | 108172165 A | 6/2018 | |
| CN | 109064993 A | 12/2018 | |

* cited by examiner

700

```
┌─────────────────────────────────────┐
│ inputting, in a first stage, the first level to the │
│ inputting signal terminal, the second level to │
│ the first clock signal terminal, and the first │──── 710
│ level to the second clock signal terminal, so │
│ that the outputting signal terminal outputs the │
│ second level │
└─────────────────────────────────────┘
                    │
                    ▼
┌─────────────────────────────────────┐
│ inputting, in a second stage, the first level to │
│ the first clock signal terminal, and the second │
│ level to the second clock signal terminal, so │──── 720
│ that the outputting signal terminal outputs the │
│ first level │
└─────────────────────────────────────┘
                    │
                    ▼
┌─────────────────────────────────────┐
│ inputting, in a third stage, the first level to the │
│ resetting signal terminal, the second level to │
│ the first clock signal terminal, and the first │──── 730
│ level to the second clock signal terminal, so │
│ that the outputting signal terminal outputs the │
│ second level │
└─────────────────────────────────────┘
                    │
                    ▼
┌─────────────────────────────────────┐
│ inputting, in a fourth stage, one of the first │
│ level and the second level to the first clock │
│ signal terminal, and the other of the first level │──── 740
│ and the second level to the second clock │
│ signal terminal, so that the outputting signal │
│ terminal outputs the second level │
└─────────────────────────────────────┘
```

Fig. 7

SHIFT REGISTER, DRIVING METHOD THEREOF, GATE DRIVING CIRCUIT AND DISPLAY DEVICE

CROSS-REFERENCE TO RELATED APPLICATION(S)

This application is a Section 371 National Stage Application of International Application No. PCT/CN2019/106911, which claims the priority of Chinese Patent Application No. 201811317635.9, filed on Nov. 6, 2018, the entire contents of which are hereby incorporated by reference.

TECHNICAL FIELD

The present disclosure relates to the field of display technology. In particular, the present disclosure relates to a shift register, a driving method thereof, a gate driving circuit and a display device.

BACKGROUND

Gate driver on array technology (GOA) fabricates a gate driving circuit along with a thin film transistor (TFT) array on an array substrate. The application of GOA technology can directly fabricates the gate driving circuit around a panel, thereby enabling a narrow bezel design.

However, due to the increased carrier mobility of thin film transistors under a high temperature environment, the operation voltage at each node in the gate driving circuit cannot be maintained. This prevents clock signals from being output correctly, which causes a problem of a splash screen.

SUMMARY

According to some embodiments of the disclosure, there is provided a shift register, a driving method thereof, a gate driving circuit and a display device.

According to one aspect, an embodiment of the present disclosure provide a shift register, comprising: an inputting sub-circuit coupled to an inputting signal terminal, a first voltage signal terminal and a pulling-up node, and configured to transmit a first voltage signal from the first voltage signal terminal to the pulling-up node under a control of an inputting signal from the inputting signal terminal; an outputting sub-circuit coupled to the pulling-up node, a first clock signal terminal, and an outputting signal terminal, and configured to transmit a first clock signal from the first clock signal terminal to the outputting signal terminal under a control of a voltage at the pulling-up node; a resetting sub-circuit coupled to a resetting signal terminal, a second voltage signal terminal and the pulling-up node, and configured to transmit a second voltage signal from the second voltage signal terminal to the pulling-up node under a control of a resetting signal from the resetting signal terminal; a pulling-down sub-circuit coupled to a pulling-down node, the second voltage signal terminal, the pulling-up node and the outputting signal terminal, and configured to transmit the second voltage signal to the pulling-up node and the outputting signal terminal respectively, under a control of a voltage at the pulling-down node; a pulling-down controlling sub-circuit coupled to the pulling-up node, the pulling-down node, a pulling-down controlling node, the first voltage signal terminal, the second voltage signal terminal, and a second clock signal terminal, and configured to transmit the first voltage signal or the second voltage signal to the pulling-down node under a control of the voltage at the pulling-up node, a voltage at the pulling-down controlling node, and a second clock signal from the second clock signal terminal; and a voltage regulating sub-circuit coupled to the pulling-down node, the pulling-down controlling node, the second clock signal terminal, a third clock signal terminal, the first voltage signal terminal and the second voltage signal terminal, and configured to regulate the voltage at the pulling-down controlling node based on the first voltage signal and the second voltage signal, under the control of the second clock signal, a third clock signal from the third clock signal terminal, and the voltage at the pulling-down node.

In some embodiments, the third clock signal is the same as the first clock signal. In some embodiments, the third clock signal has a frequency being equal to the second clock signal but higher than the first clock signal.

In some embodiments, the inputting sub-circuit comprises: a first transistor having a controlling electrode coupled to the inputting signal terminal, a first electrode coupled to the first voltage signal terminal, and a second electrode coupled to the pulling-up node.

In some embodiments, the outputting sub-circuit comprises: a second transistor having a controlling electrode coupled to the pulling-up node, a first electrode coupled to the first clock signal terminal, and a second electrode coupled to the outputting signal terminal; and a first capacitor having a first terminal coupled to the pulling-up node, and a second terminal coupled to the outputting signal terminal.

In some embodiments, the resetting sub-circuit comprises: a third transistor having a controlling electrode coupled to the resetting signal terminal, a first electrode coupled to the second voltage signal terminal, and a second electrode coupled to the pulling-up node.

In some embodiments, the pulling-down sub-circuit comprises: a fourth transistor having a controlling electrode coupled to the pulling-down node, a first electrode coupled to the second voltage signal terminal, and a second electrode coupled to the pulling-up node; and a fifth transistor having a controlling electrode coupled to the pulling-down node, a first electrode coupled to the second voltage signal terminal, and a second electrode coupled to the outputting signal terminal.

In some embodiments, the pulling-down controlling sub-circuit comprises: a sixth transistor having a controlling electrode coupled to the pulling-down controlling node, a first electrode coupled to the first voltage signal terminal, and a second electrode coupled to the pulling-down node; a seventh transistor having a controlling electrode coupled to the pulling-up node, a first electrode coupled to the second voltage signal terminal, and a second electrode coupled to the pulling-down node; an eighth transistor having a controlling electrode coupled to the pulling-up node, a first electrode coupled to the second voltage signal terminal, and a second electrode coupled to the pulling-down controlling node; and a ninth transistor having a controlling electrode coupled to the second clock signal terminal, a first electrode coupled to the first voltage signal terminal, and a second electrode coupled to the pulling-down controlling node.

In some embodiments, the voltage regulating sub-circuit comprises: a second capacitor having a first terminal coupled to the pulling-down controlling node, and a second terminal coupled to a second electrode of a tenth transistor and a second electrode of an eleventh transistor; the tenth transistor having a controlling electrode coupled to the second clock signal terminal, and a first electrode coupled to the second voltage signal terminal; and the eleventh transistor having a controlling electrode coupled to the third clock signal terminal, and a first electrode coupled to the pulling-down node.

In some embodiments, the shift register further comprises: a global resetting sub-circuit coupled to a global resetting signal terminal and the pulling-down node, and configured to transmit a global resetting signal from the global resetting signal terminal to the pulling-down node, under a control of the global resetting signal. In some embodiments, the global resetting sub-circuit comprises: a twelfth transistor having a controlling electrode and a first electrode coupled to the global resetting signal terminal, and a second electrode coupled to the pulling-down node.

In some embodiments, a ratio of an aspect ratio of a channel of the fifth transistor to the aspect ratio of a channel of the sixth transistor is less than 1/5. In some embodiments, all of the transistors are N-type transistors, the first voltage signal being a high-level signal, and the second voltage signal being a low-level signal. In some embodiments, at least one of the first clock signal, the second clock signal, and the third clock signal has a duty cycle less than 50%.

According to another aspect, the embodiments of the present disclosure further provide a gate driving circuit comprising a plurality of cascaded shift registers according to the embodiments of the present disclosure.

According to yet another aspect, the embodiments of the present disclosure further provide a display device comprising the gate driving circuit according to the embodiments of the present disclosure.

According to still another aspect, the embodiments of the present disclosure further provide a method for driving the shift register according to the embodiments of the present disclosure. The method comprises: inputting, in a first stage, the first level to the inputting signal terminal, the second level to the first clock signal terminal, and the first level to the second clock signal terminal, so that the outputting signal terminal outputs the second level; inputting, in a second stage, the first level to the first clock signal terminal, and the second level to the second clock signal terminal, so that the outputting signal terminal outputs the first level; inputting, in a third stage, the first level to the resetting signal terminal, the second level to the first clock signal terminal, and the first level to the second clock signal terminal, so that the outputting signal terminal outputs the second level; and inputting, in a fourth stage, one of the first level and the second level to the first clock signal terminal, and the other of the first level and the second level to the second clock signal terminal, so that the outputting signal terminal outputs the second level.

BRIEF DESCRIPTION OF THE DRAWINGS

The above and other objects, features, and advantages of the present disclosure will be made clearer by describing the preferred embodiments of the present disclosure with reference to the accompanying drawings, in which:

FIG. 7 is a flowchart illustrating an example method of driving a shift register according to an embodiment of the present disclosure;

DETAILED DESCRIPTION

Figure 1:
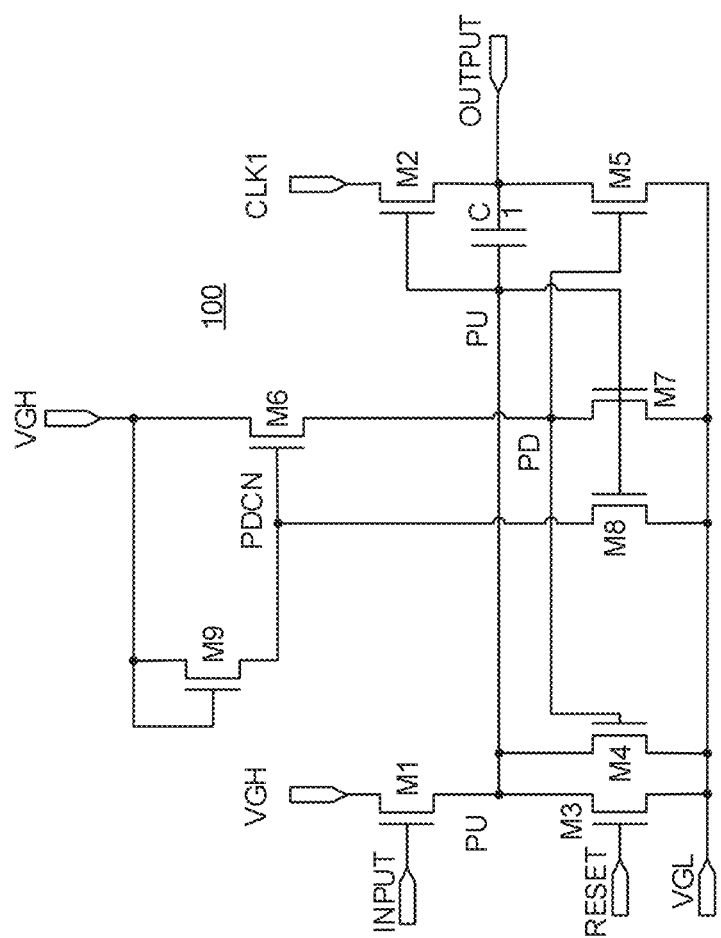
FIG. 1 is a schematic diagram illustrating an example specific configuration of a shift register.

Hereinafter, some embodiments of the present disclosure will be described in detail with reference to the accompanying drawings. Details and functions that are unnecessary for the present disclosure are omitted in the description to prevent confusion in the understanding of the present disclosure. In this specification, various embodiments described below for describing the principles of the present disclosure are merely illustrative and should not be construed as limiting the scope of the disclosure in any way. The following description with reference to the accompanying drawings is provided to assist in achieving a comprehensive understanding of exemplary embodiments of the present disclosure as defined by the claims and their equivalents. The following description includes various specific details to assist the understanding, but these details should be considered as merely exemplary. Accordingly, those of ordinary skill in the art should recognize that various changes and modifications can be made to the embodiments described herein without departing from the scope and spirit of the present disclosure. In addition, descriptions of well-known functions and constructions are omitted for clarity and conciseness. Further, throughout the drawings, the same reference numerals are used for the same or similar functions, devices, and/or operations. Moreover, in the drawings, various parts are not necessarily drawn to scale. In other words, the relative sizes, lengths, etc. of the parts in the drawings do not necessarily correspond to the true proportions.

In addition, in the description of the embodiments of the present disclosure, the technical terms or scientific terms used in the present disclosure shall have ordinary meanings understood by persons having ordinary skills in the field to which the present disclosure belongs, unless otherwise defined. The terms "first", "second", and the like used in this disclosure do not indicate any order, quantity, or importance, but are only used to distinguish different components. Similarly, "a", "an", or "the" and the like do not indicate a limit on the quantity, but rather indicate that there is at least one such element. Expressions such as "including" or "comprising" mean that the elements or items appearing before the expression encompass the elements or parts appearing after the expression and their equivalents, without precluding other elements or parts.

In addition, in the description of the embodiment of the present disclosure, the terms "first level" and "second level" are only used to distinguish the amplitudes of the two levels. For example, in the following description, the "first level" is a relatively high level and the "second level" is a relatively low level. Those skilled in the art can understand that the present disclosure is not limited thereto.

The following description is made by taking a gate driving circuit for a display device according to an embodiment of the present disclosure as an example. However, those skilled in the art should understand that the application field of the present disclosure is not limited thereto. In fact, the shift register and the like according to the embodiment of the present disclosure can be applied to other fields that require the use of the shift register.

In addition, although a transistor is described as an N-type transistor in the following description, the present disclosure is not limited thereto. In fact, as can be understood by those skilled in the art, when one or more of respective transistors mentioned below are P-type transistors, the technical solution of the present application can also be implemented, as long as a corresponding adjustment is made on the level setting/coupling relationship.

FIG. 1 is a schematic diagram illustrating an example specific configuration of a shift register 100. The shift register 100 includes nine transistors M1 to M9 and one capacitor C1. The shift register 100 may control the voltages at the pulling-up node (hereinafter also referred to as the PU node), the pulling-down node (hereinafter also referred to as the PD node) and/or the pulling-down controlling node (hereinafter also referred to as PDCN) respectively, under a control of a first clock signal from a first clock signal terminal CLK1, an inputting signal from the inputting signal terminal INPUT, a resetting signal from the resetting signal terminal RESET, a first voltage signal from the first voltage signal terminal VGH, and a second voltage signal from the second voltage signal terminal VGL, and finally shifts the inputting signal from the inputting signal terminal INPUT, so as to function as one of the cascade units in the gate drive circuit.

However, in such a shift register design, since it is difficult to make a trade off between the narrow frame design and the high voltage at the pulling-down node (hereinafter sometimes referred to as PD node), the reserved voltage margin at the PD node is insufficient, causing a splash screen problem in a high temperature environment.

For example, in the design of the shift register shown in FIG. 1, under a high temperature environment, for example, due to the high ambient temperature or the high temperature caused by the heat dissipation of a long-term device, the transistor's electron migration rate increases and leakage current increases. Thus, it is impossible to maintain the voltage of the first voltage signal from the first voltage signal terminal VGH and thus the voltage at the pulling-down node PD, so that the voltage at the PD node will drop to a certain extent. Due to insufficient voltage margin design at the PD node, when, for example, the voltage at the pulling-down node PD drops below the normal operation threshold, the shift register 100 cannot be reset normally. Therefore, the first clock signal from the first clock signal terminal CLK1 cannot be output correctly. This results in that the pixel transistor in a visible area cannot be normally turned on and off, and the pixel voltage cannot be written correctly, causing a splash screen problem.

Hereinafter, a shift register and a driving method thereof, a gate driving circuit, and a display device according to embodiments of the present disclosure will be described in detail with reference to FIGS. 2 to 10. The gate voltage of the transistor (for example, transistor M6 in FIG. 1) used to charge and discharge at the PD node is increased by the boosting function of newly added circuit part (for example, 2T1C, that is, 2 transistors and 1 capacitor), thereby reducing the equivalent internal resistance of the transistor M6 and increasing the voltage at the PD node. The increase in the voltage at the PD node can provide greater margin to cope with the high temperature environment, thereby improving the problem of splash screen in high temperature environment. At the same time, because the newly added circuit part (for example, 2T1C) has a small footprint, and the effect of increasing the gate-source voltage of the transistor is obvious, it results in a good compromise between the narrow frame design and the high voltage at the PD node.

Therefore, in actual design, one way to increase the voltage margin at the PD node is to reduce the on-resistance of for example the transistor M6 shown in FIG. 1 by increasing an aspect ratio of the channel of the sixth transistor M6 (for example, increasing the width of the conductive channel of the sixth transistor M6), and reduce the difference between the voltage at the PD node and the voltage of the first voltage signal terminal VGH, so that the high voltage at the PD node does not fall below the threshold for triggering the splash screen in a high temperature environment. However, based on the current amorphous silicon process, the ratio of an aspect ratio of a channel of the sixth transistor M6 to the aspect ratio of a channel of the seventh transistor M7 is required to be less than 1/5, so as to enable the voltage at the PD node to be pulled down to the second voltage at the second voltage signal terminal VGL, when the sixth transistor M6 and the seven transistors M7 are both turned on. However, in the case of a narrow frame, it is difficult to increase the aspect ratio of the channel of the sixth transistor M6, or more specifically, difficult to increase the channel width of the sixth transistor M6.

Figure 2:
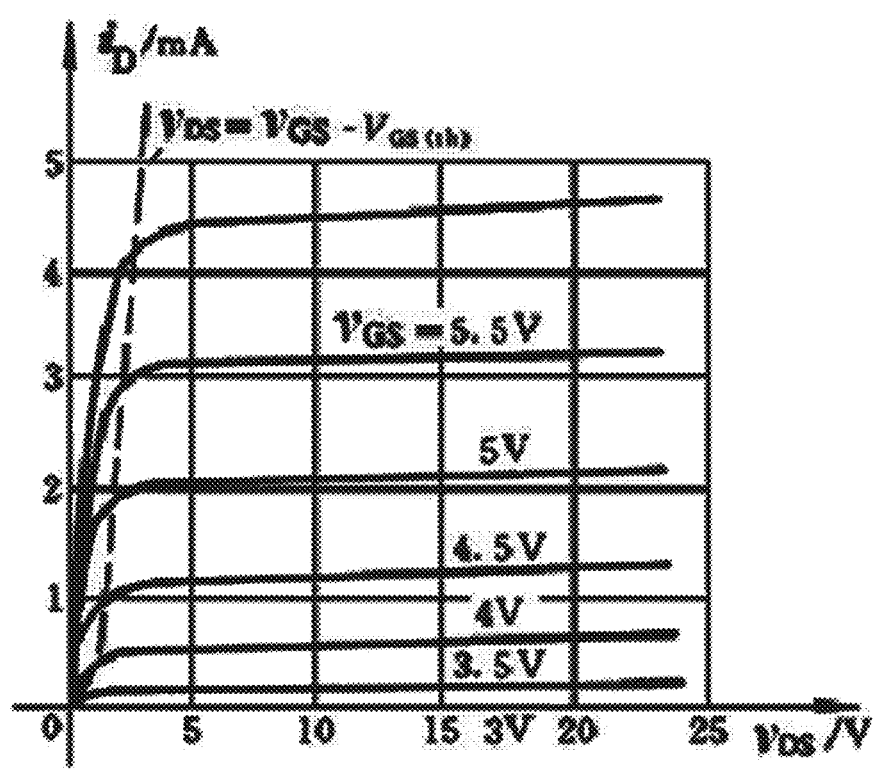
FIG. 2 is a graph illustrating curves for comparing currents of a transistor under different gate-source voltages according to an embodiment of the present disclosure.

Another way is to reduce the on-resistance of the transistor M6 by increasing the gate-source voltage Vgs of the sixth transistor M6. FIG. 2 is a graph illustrating curves for comparing currents of a transistor under different gate-source voltages Vgs according to an embodiment of the present disclosure. It can be seen in FIG. 2 that under the condition with the same Vds, increasing the Vgs voltage can increase the current of the transistor in the saturation region, thereby reducing the equivalent internal resistance of the transistor in the saturation region and increasing the voltage at the PD node.

Hereinafter, a shift register according to an embodiment of the present disclosure will be described in detail with reference to FIG. 3.

Figure 3:
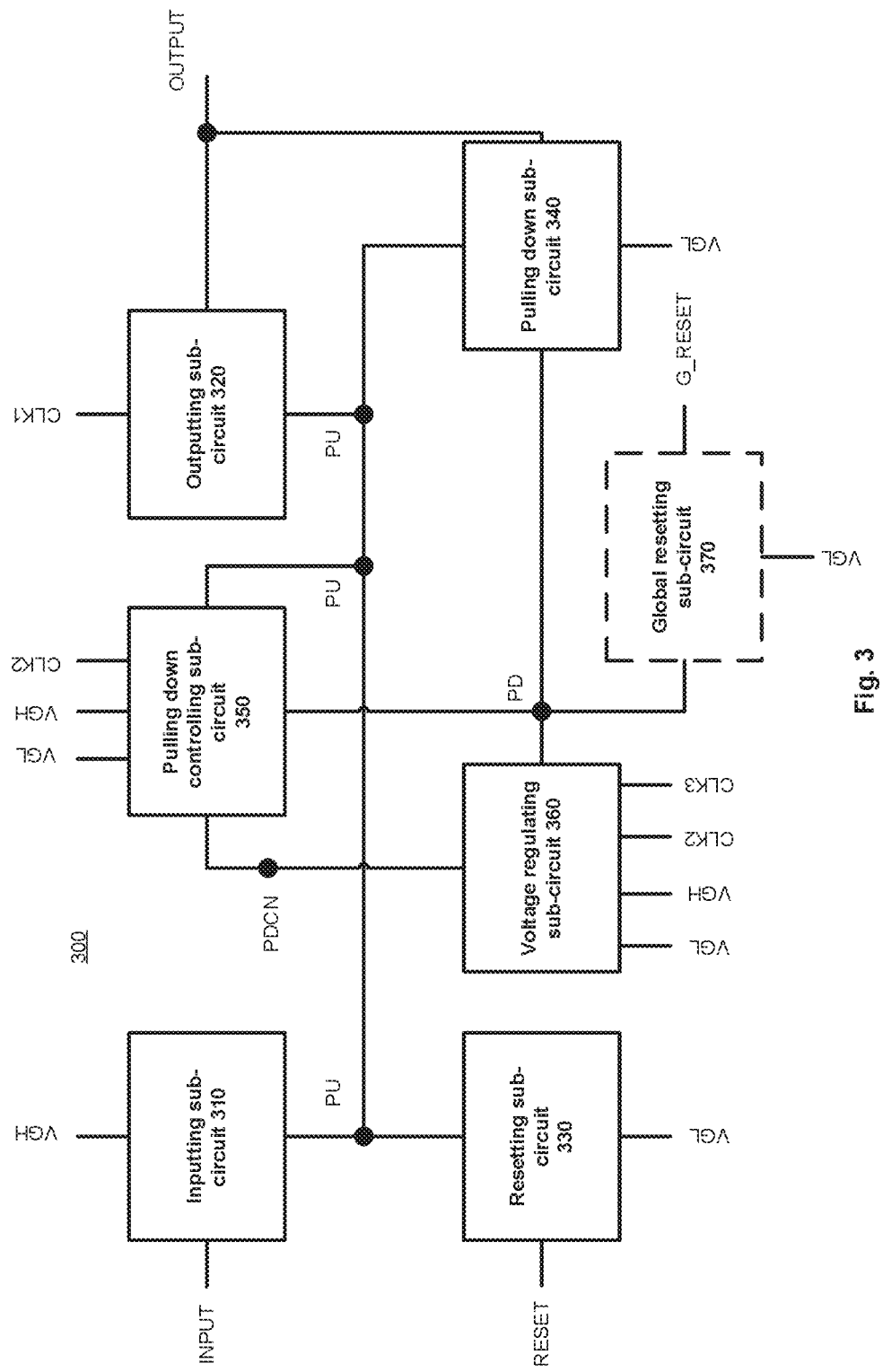
FIG. 3 is a schematic diagram illustrating an example configuration of a shift register according to an embodiment of the present disclosure.

FIG. 3 is a schematic diagram illustrating an example configuration of a shift register 300 according to an embodiment of the present disclosure. As shown in FIG. 3, the shift register 300 may include: an inputting sub-circuit 310, an outputting sub-circuit 320, a resetting sub-circuit 330, a pulling-down sub-circuit 340, a pulling-down controlling sub-circuit 350, and a voltage regulating sub-circuit 360. In addition, in some embodiments, the shift register 300 may further include a global resetting sub-circuit 370.

In some embodiments, the inputting sub-circuit 310 may be coupled to an inputting signal terminal INPUT, a first voltage signal terminal VGH and a pulling-up node PU, and configured to transmit a first voltage signal from the first voltage signal terminal VGH to the pulling-up node PU under a control of an inputting signal from the inputting signal terminal INPUT.

In some embodiments, the outputting sub-circuit 320 may be coupled to the pulling-up node PU, a first clock signal terminal CLK1, and an outputting signal terminal OUTPUT, and configured to transmit a first clock signal from the first clock signal terminal CLK1 to the outputting signal terminal OUTPUT under a control of a voltage at the pulling-up node PU.

In some embodiments, the resetting sub-circuit 330 may be coupled to a resetting signal terminal RESET, a second voltage signal terminal VGL and the pulling-up node PU, and configured to transmit a second voltage signal from the second voltage signal terminal VGL to the pulling-up node PU under a control of a resetting signal from the resetting signal terminal RESET.

In some embodiments, the pulling-down sub-circuit 340 may be coupled to a pulling-down node PD, the second voltage signal terminal VGL, the pulling-up node PU and the outputting signal terminal OUTPUT, and configured to transmit the second voltage signal to the pulling-up node PU and the outputting signal terminal OUTPUT respectively, under a control of a voltage at the pulling-down node PD.

In some embodiments, the pulling-down controlling sub-circuit 350 may be coupled to the pulling-up node PU, the pulling-down node PD, a pulling-down controlling node PDCN, the first voltage signal terminal VGH, the second voltage signal terminal VGL, and a second clock signal terminal CLK2, and configured to transmit the first voltage signal or the second voltage signal to the pulling-down node PD under a control of the voltage at the pulling-up node PU, a voltage at the pulling-down controlling node PDCN, and a second clock signal from the second clock signal terminal CLK2.

In some embodiments, the voltage regulation sub-circuit 360 may be coupled to the pulling-down node PD, the pulling-down controlling node PDCN, the second clock signal terminal CLK2, a third clock signal terminal CLK3, the first voltage signal terminal VGH and the second voltage signal terminal VGL, and configured to regulate the voltage at the pulling-down controlling node PDCN based on the first voltage signal and the second voltage signal, under the control of the second clock signal, a third clock signal from the third clock signal terminal CLK, and the voltage at the pulling-down node PD.

By using the shift register with the above-mentioned design, the voltage at the pulling-down controlling node PDCN can be regulated by the voltage regulating sub-circuit 360, thereby increasing the operation voltage at the gate of the transistor controlled by the pulling-down controlling node PDCN and reducing the internal resistance of the transistor. Finally, the voltage at the pulling-down node can be increased, avoiding the splash screen phenomenon.

Figure 4:
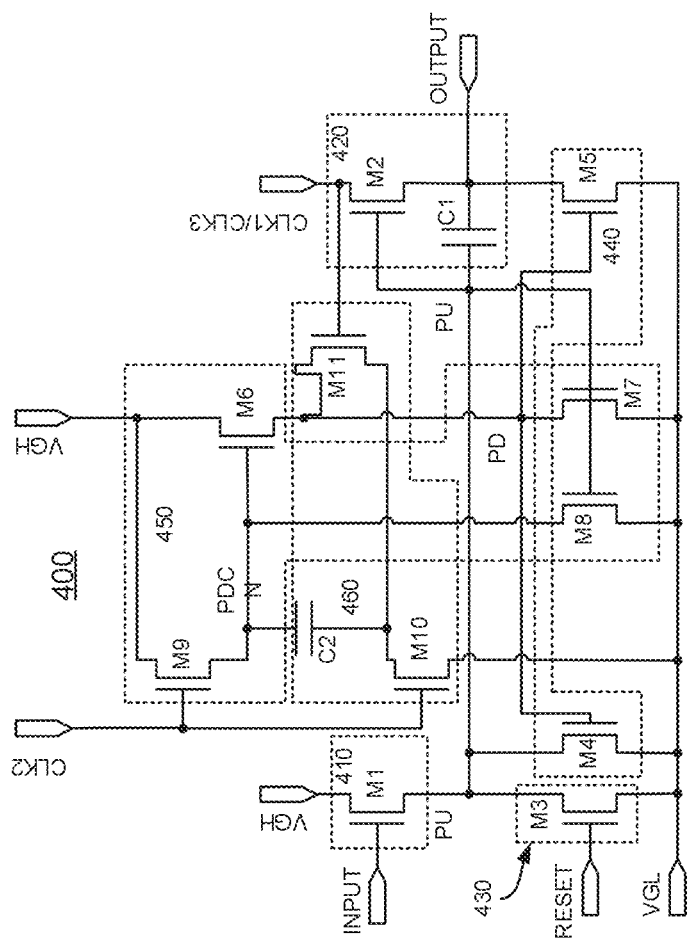
FIG. 4 is a schematic diagram illustrating an example specific configuration of the shift register shown in FIG. 3.

In some embodiments, such as the embodiment shown in FIG. 4, the third clock signal terminal CLK3 and the first clock signal terminal CLK1 may provide the same clock signal, or even they may be the same clock signal terminal, so as to simplify the design of the circuit. In other embodiments, for example, in the embodiment shown in FIG. 9, the third clock signal from the third clock signal terminal CLK3 may have a frequency being equal to the second clock signal and higher than the first clock signal terminal CLK1, so as to make the voltage at the PDCN node rise faster, and make the voltage at the PD node rise faster, further avoiding the splash screen phenomenon.

In addition, as described above, the shift register 300 may further include a global resetting sub-circuit 370. The global resetting sub-circuit 370 may be coupled to a global resetting signal terminal G_RESET and the pulling-down node PD, and configured to transmit a global resetting signal from the global resetting signal terminal to the pulling-down node PD, under a control of the global resetting signal G_RESET. By using the global resetting sub-circuit 370, the shift register 300 can be reset at any desired time, so as to meet the desired design requirements. For example, scanning of the current frame may be terminated early.

Next, an example implementation of the shift register 300 shown in FIG. 3 will be described in detail with reference to FIG. 4. It should be noted that the implementation of the shift register 300 shown in FIG. 3 is not limited to the embodiment shown in FIG. 4, but may include various sub-circuits implemented in other ways.

FIG. 4 is a schematic diagram illustrating an example specific configuration 400 of the shift register 300 shown in FIG. 3. As shown in FIG. 4, similar to the shift register 300 shown in FIG. 3, the shift register 400 may include an inputting sub-circuit 410, an outputting sub-circuit 420, a resetting sub-circuit 430, a pulling-down sub-circuit 440, a pulling-down controlling sub-circuit 450, and a voltage regulating sub-circuit 460.

In some embodiments, the inputting sub-circuit 410 may include a first transistor M1 having a controlling electrode coupled to the inputting signal terminal INPUT, a first electrode coupled to the first voltage signal terminal VGH, and a second electrode coupled to the pulling-up node PU. The inputting sub-circuit 410 may be configured to transmit a first voltage signal from the first voltage signal terminal VGH to the pulling-up node PU under a control of an inputting signal from the inputting signal terminal INPUT.

In some embodiments, the outputting sub-circuit 420 may include a second transistor M2 having a controlling electrode coupled to the pulling-up node PU, a first electrode coupled to the first clock signal terminal CLK1, and a second electrode coupled to the outputting signal terminal OUTPUT. In addition, the outputting sub-circuit 420 may further include a first capacitor C1 having a first terminal coupled to the pulling-up node PU, and a second terminal coupled to the outputting signal terminal OUTPUT. The outputting sub-circuit 420 may be configured to transmit a first clock signal from the first clock signal terminal CLK1 to the outputting signal terminal OUTPUT under a control of a voltage at the pulling-up node PU.

In some embodiments, the resetting sub-circuit 430 may include a third transistor M3 having a controlling electrode coupled to the resetting signal terminal RESET, a first electrode coupled to the second voltage signal terminal VGL, and a second electrode coupled to the pulling-up node PU. The resetting sub-circuit 430 may be configured to transmit a second voltage signal from the second voltage signal terminal VGL to the pulling-up node PU under a control of a resetting signal from the resetting signal terminal RESET.

In some embodiments, the pulling-down sub-circuit 440 may include a fourth transistor M4 having a controlling electrode coupled to the pulling-down node PD, a first electrode coupled to the second voltage signal terminal VGL, and a second electrode coupled to the pulling-up node PU. The pulling-down sub-circuit 440 may further include a fifth transistor M5 having a controlling electrode coupled to the pulling-down node PD, a first electrode coupled to the second voltage signal terminal VGL, and a second electrode coupled to the outputting signal terminal OUTPUT. The pulling-down sub-circuit 450 may be configured to transmit the second voltage signal to the pulling-up node PU and the outputting signal terminal OUTPUT respectively, under a control of a voltage at the pulling-down node PD.

In some embodiments, the pulling-down controlling sub-circuit 450 may include a sixth transistor M6 having a controlling electrode coupled to the pulling-down controlling node PDCN, a first electrode coupled to the first voltage signal terminal VGH, and a second electrode coupled to the pulling-down node PD. The pulling-down controlling sub-circuit 450 may further include a seventh transistor M7 having a controlling electrode coupled to the pulling-up node PU, a first electrode coupled to the second voltage signal terminal VGL, and a second electrode coupled to the pulling-down node PD. The pulling-down controlling sub-circuit 450 may further include an eighth transistor M8 having a controlling electrode coupled to the pulling-up node PU, a first electrode coupled to the second voltage signal terminal VGL, and a second electrode coupled to the pulling-down controlling node PDCN. The pulling-down controlling sub-circuit 450 may further include a ninth transistor M9 having a controlling electrode coupled to the second clock signal terminal CLK2, a first electrode coupled to the first voltage signal terminal VGH, and a second electrode coupled to the pulling-down controlling node PDCN. The pulling-down controlling sub-circuit 450 may be configured to transmit the first voltage signal or the second voltage signal to the pulling-down node PD under a control of the voltage at the pulling-up node PU, a voltage at the pulling-down controlling node PDCN, and the second clock signal.

In some embodiments, the voltage regulating sub-circuit 460 may include a second capacitor C2 having a first terminal coupled to the pulling-down controlling node PDCN, and a second terminal coupled to a second electrode of a tenth transistor M10 and a second electrode of an eleventh transistor M11. The voltage regulating sub-circuit 460 may further include the tenth transistor M10 having a controlling electrode coupled to the second clock signal terminal CLK2, and a first electrode coupled to the second voltage signal terminal VGL. The voltage regulating sub-circuit may further include the eleventh transistor M11 having a controlling electrode coupled to the third clock signal terminal CLK3 (or as shown in FIG. 4, coupled to the first clock signal terminal CLK1, when the first clock signal terminal CLK1 and the third clock signal terminal CLK3 provide the same clock signal), and a second electrode coupled to the pulling-down node PD.

Figure 5:
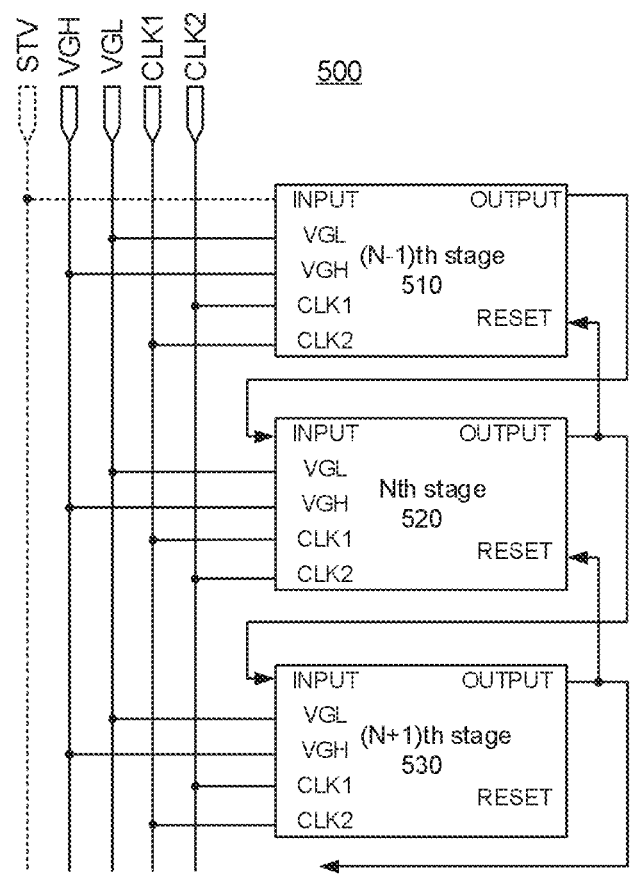
FIG. 5 is a schematic diagram illustrating an example configuration of a gate driving circuit according to an embodiment of the present disclosure.

Next, a schematic diagram of an example configuration of a gate driving circuit according to an embodiment of the present disclosure will be described with reference to FIG. 5. FIG. 5 is a schematic diagram illustrating an example configuration of a gate driving circuit 500 according to an embodiment of the present disclosure. The gate driving circuit 500 may include a plurality of cascaded shift registers 510, 520, 530, and the like. Although only three shift registers are shown in the embodiment shown in FIG. 5, the embodiments of the present disclosure are not limited thereto, and any number of shift registers may be adopted. In some embodiments, each shift register shown in FIG. 5 may be the shift register 300 shown in FIG. 3, the shift register 400 shown in FIG. 4, or a shift register 800 or 900 shown in FIG. 8 or FIG. 9. However, the present disclosure is not limited thereto, and in other embodiments, the gate driving circuit 500 shown in FIG. 5 may utilize at least one of the shift registers 300, 400, 800 and 900 according to an embodiment of the present disclosure partially, and another part of the gate driving circuit may use the shift registers (for example, shift register 100) which may be already known or developed in the future.

As shown in FIG. 5, for each shift register (for example, the $N^{th}$ stage of shift register 520), it may have an inputting terminal INPUT (N) coupled to the outputting terminal OUTPUT (N−1) of its previous stage of shift register (for example, the $N−1^{th}$ stage of shift register 510), an outputting terminal OUTPUT (N) coupled to the inputting terminal INPUT (N+1) of its next stage of shift register (for example, the $N+1^{th}$ stage of shift register 530) and the resetting signal terminal RESET (N−1) of its previous stage of shift register (for example, the $N−1^{th}$ stage of shift register 510), and a resetting signal terminal RESET (N) coupled to the outputting terminal OUTPUT (N+1) of its next stage of shift register (for example, the $N+1^{th}$ stage of shift register 530). In addition, the inputting terminal INPUT of the first stage of shift register may, for example, be coupled to a Start Vertical (or STV) signal line, so as to receive an STV signal indicating the start of scanning of a frame (for example, STV indicated by the dotted lines, as shown at the leftmost side in FIG. 5). In addition, in other embodiments, for example, in the case where the shift register 300 shown in FIG. 3 includes the global resetting sub-circuit 370, the STV signal line may be coupled to the global resetting signal terminal G_RESET of each shift register, so as to use the STV signal as the global resetting signal.

In addition, as shown in FIG. 5, two adjacent stages of shift registers (for example, the $N^{th}$ stage of shift register 520 and the $N−1^{th}$ stage of shift register 510 or the $N+1^{th}$ stage of shift register 530) have their first clock signal terminals CLK1 and the second clock signal terminals CLK2 coupled to different clock signal lines CLK1 and CLK2 alternatively in turn. In some embodiments, the CLK1 and CLK2 may provide clock signals with waveforms difference of for example half a clock cycle (corresponding to a phase difference of $n\pi$). For example, the $N^{th}$ stage of shift register 520 has its first clock signal terminal CLK1 coupled to the CLK1 line and its second clock signal terminal CLK2 coupled to the CLK2 line, and the $N−1^{th}$ stage of shift register 510 and the $N+1^{th}$ stage of shift register 530 have their first clock signal terminals CLK1 coupled to the CLK2 line, and their second clock signal terminals CLK2 coupled to the CLK1 line, realizing the operation timing diagram shown in FIG. 6. In addition, as shown in FIG. 5, the first voltage signal terminal VGH and the second voltage signal terminal VGL of each shift register may be coupled to the VGH line and the VGL line respectively, so as to receive the first voltage signal and the second voltage signal correspondingly. In some embodiments, for example, in the embodiments where N-type transistors are used to constitute the shift register, VGH may be a high-level signal higher than the threshold voltage of the transistor, and VGL may be a low-level signal lower than the threshold voltage of the transistor signal.

Next, based on the specific structure of the shift register 400 of FIG. 4 and the cascade relationship shown in the gate driving circuit 500 of FIG. 5, the operation timing of the shift register 400 will be described in detail with reference to FIG. 6.

Figure 6:
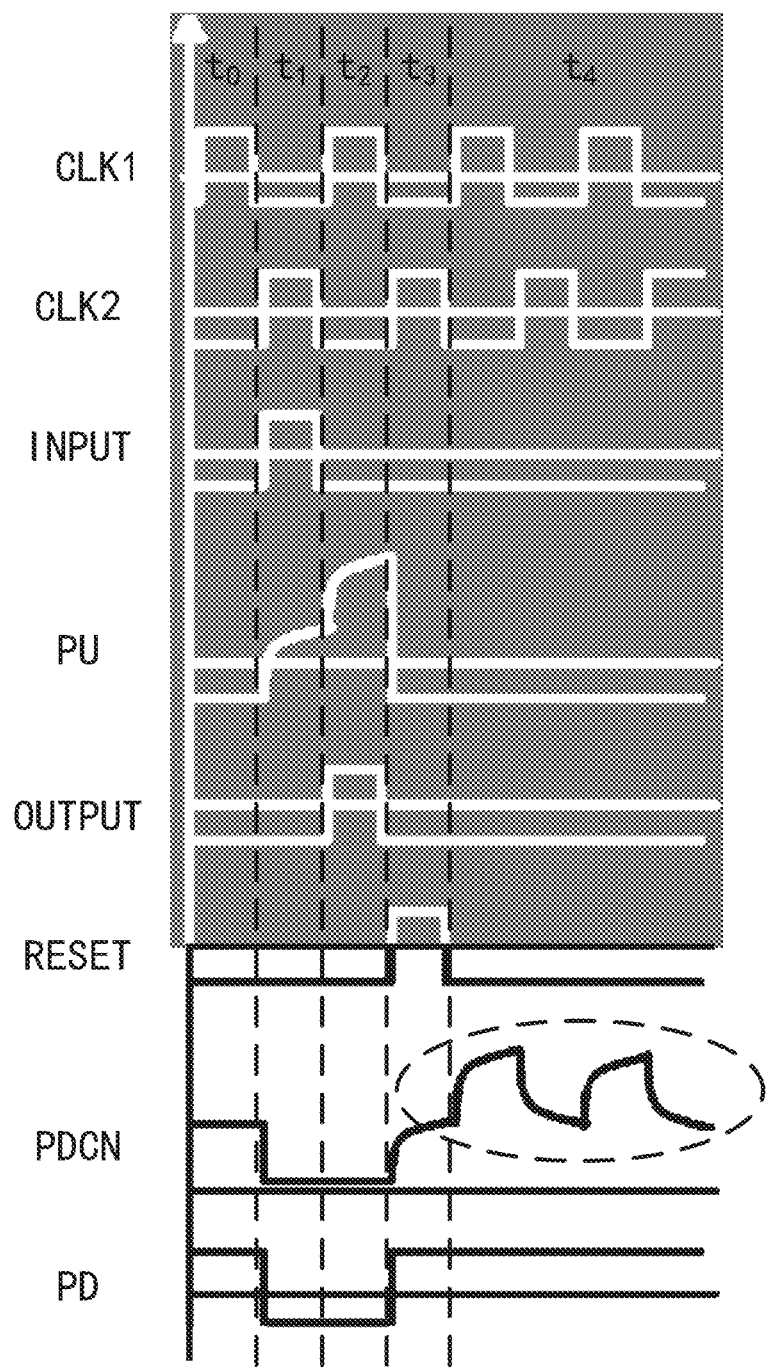
FIG. 6 is an exemplary operation timing diagram for the shift register shown in FIG. 4.

FIG. 6 is an exemplary operation timing diagram for the shift register 400 shown in FIG. 4, which has a cascade relationship as shown in FIG. 5 with other shift registers.

In the following examples, the description is made by taking the switching transistor being an N-type transistor as an example, but the present disclosure is not limited thereto. As can be understood by those skilled in the art, when one or more of the transistors mentioned below are P-type transistors, the technical solution of the present application can also be implemented, as long as a corresponding adjustment is made on the level setting or the coupling relationship. In addition, the following description is exemplarily explained by considering the "first level" as a relatively high level and the "second level" as a relatively low level. However, those skilled in the art would understand that the present disclosure is not limited to this, and the "first level" can be considered as a level enabling the switching transistor to be turned on, and the "second level" can be considered as a level enabling the switching transistor to be turned off.

As shown in FIG. 6, during a period of a frame, operations of the shift register 400 may include a first stages t1 to a fourth stage t4.

In the first stage t1, the first level (for example, a high level) is input to the inputting signal terminal INPUT, the second level (for example, a high level) is input to the resetting signal terminal RESET and the first clock signal terminal CLK1, and the first level is input to the second clock signal terminal CLK2, so that the outputting signal terminal OUTPUT outputs the second level.

Referring to FIG. 4, since the inputting signal terminal INPUT is at the high level (that is, the high-level outputting signal from the previous stage of shift register as shown in FIG. 5), the first transistor M1 is turned on, so that the pulling-up node PU is charged to the high level and meanwhile the first capacitor C1 is enabled to start charging. At the same time, the voltage at the pulling-up node PU is at the high level, and thus the seventh transistor M7 and the eighth transistor M8 are both turned on. Accordingly, the pulling-down node PD and the pulling-down controlling node PDCN are both set to the low level, that is, maintained at the same level as the second voltage signal terminal VGL. In addition, the second clock signal terminal CLK2 is at the high level, and the tenth transistor M10 is turned on. Thus, the voltages at terminals of the second capacitor C2 are both low, which is equivalent to resetting the second capacitor C2. In addition, although the ninth transistor M9 is now turned on, the pulling-down controlling node PDCN can be maintained at the low level at this time by designing a ratio of an aspect ratio of a channel of the eighth transistor M8 to the aspect ratio of a channel of the ninth transistor M9 to an appropriate value. In addition, since the pulling-up node PU is at the high level, the second transistor M2 is turned on, and the outputting signal terminal OUTPUT outputs a clock signal from the first clock signal terminal CLK1, and thus is at the low level at this time.

In the second stage t2, the low level is input to the inputting signal terminal INPUT, the low level is input to the resetting signal terminal RESET, the high level is input to the first clock signal terminal CLK1, and the low level is input to the second clock signal terminal CLK2. The outputting signal terminal OUTPUT outputs the high level.

Referring to FIG. 4, in this stage, the inputting signal terminal INPUT is at the low level, thus the first transistor M1 is turned off. Since the PU node remains at the high level, the second transistor M2 remains in a turned on state. At this time, since the first clock signal of the first clock signal terminal CLK1 is at the high level, the voltage at the pulling-up node is enabled to increase due to the bootstrapping of the first capacitor C1, and the pulling-down node PD and the pulling-down controlling node PDCN are kept at the low level, as shown in FIG. 6. Thereby, the outputting signal terminal OUTPUT is enabled to output the first clock signal of the high level from the first clock signal terminal CLK1.

In the third stage t3, the low level is input to the inputting signal terminal INPUT, the high level is input to the resetting signal terminal RESET, the low level is input to the first clock signal terminal CLK1, and the high level is input to the second clock signal terminal CLK2. Thus, the outputting signal terminal OUTPUT outputs the low level.

Referring to FIG. 4, in this stage, the resetting signal from the resetting signal terminal RESET is at the high level (for example, the high-level outputting signal from the next stage of shift register, as shown in FIG. 5), and thus the third transistor M3 is turned on. Therefore, the pulling-up node PU becomes the low level, and then the second transistor M2, the seventh transistor M7, and the eighth transistor M8 are turned off. In addition, since the second clock signal terminal CLK2 is at the high level, the ninth transistor M9 and the tenth transistor M10 are turned on. Therefore, the pulling-down controlling node PDCN becomes the high level due to the ninth transistor M9, and meanwhile charges the second capacitor C2. Since the tenth transistor M10 is turned on, the second terminal of the second capacitor C2 is a second voltage signal with the low level. In addition, because the pulling-down controlling node PDCN is at the high level, the sixth transistor M6 is turned on, thereby causing the pulling-down node PD to be at the high level consistent with the first voltage signal terminal VGH, which in turn turns on the fourth transistors M4 and the fifth transistor M5. Finally, this cause the pulling-up node PU to be kept at the low level, thereby further keeping the voltages of the outputting signal terminal OUTPUT and the pulling-up node PU at the low level.

In the fourth stage t4, the low level is input to the inputting signal terminal INPUT, the low level is input to the resetting signal terminal RESET, one of the high level and the low level is input to the first clock signal terminal CLK1, and the other of the high level and the low level is input to the second clock signal terminal CLK2 correspondingly. Thus, the outputting signal terminal OUTPUT is maintained at the low level.

Referring to FIG. 4, in this stage, when the first clock signal of the first clock signal terminal CLK1 is at the high level, the eleventh transistor M11 is turned on, so that the second terminal of the second capacitor C2 becomes the high level as same as the pulling-down node PD. At this time, the pulling-down controlling node PDCN is enabled to be further increased, due to the bootstrapping of the second capacitor C2. In addition, when the first clock signal from the first clock signal terminal CLK1 is at the low level, since the second clock signal from the second clock signal terminal CLK2 is at the high level at this time, the two terminals of the second capacitor C2 are equivalently coupled to the first voltage signal terminal VGH (through the ninth transistor M9 that is turned on) and the second voltage signal terminal VGL (through the tenth transistor M10 that is turned on) respectively. Thus, at least the voltage difference can be maintained. In this way, with the repeating of the clock cycle, for the voltage at the PDCN node, the fluctuation under the high-level as shown in the dashed box in FIG. 6 is formed, thereby providing the greater voltage margin for the shift register 400. This ensures that even in a case where the power consumption of the gate driving circuit is too high in the high-temperature environment, the splash screen phenomenon caused by insufficient voltage margin can be avoided or at least alleviated.

Those skilled in the art can understand that the embodiment according to the present disclosure may further include a preparation stage t0. In the preparation phase t0, the low level is input to the inputting signal terminal INPUT, the low level is input to the resetting signal terminal RESET, the high level is input to the first clock signal terminal CLK1, and the low level is input to the second clock signal terminal CLK2. Thus, the outputting signal terminal OUTPUT outputs the low level.

Referring to FIG. 4, when the low level is input to the inputting signal terminal INPUT and the resetting signal terminal RESET both, the first transistor M1 and the third transistor M3 are both turned off. In addition, since the low level is input to the second clock signal terminal CLK2, the ninth transistor M9 and the tenth transistor M10 are both turned off, so the pulling-down controlling node PDCN is maintained at the high level, and in turn the pulling-down node PD is maintained at the high level. Furthermore, since the pulling-down node PD is at the high level, the fourth transistor M4 and the fifth transistor M5 are turned on, so that both the pulling-up node PU and the outputting signal terminal OUTPUT are maintained at the low level. Those skilled in that art would understand that the preparation stage t0 is actually a part of the fourth stage t4 in the previous frame period, and reference may be made to the description in the fourth stage t4 described in detail below.

In addition, in some embodiments, for example, when the duty cycles of the first clock signal terminal CLK1 (and a third clock signal terminal CLK3 described later) and the second clock signal terminal CLK2 are both less than 50%, the process of charging and boosting the second capacitor C2 in this stage can also be achieved. Hereinafter, the process will be described in detail based on FIG. 4 to FIG. 6 in combination with FIG. 10.

Figure 10:
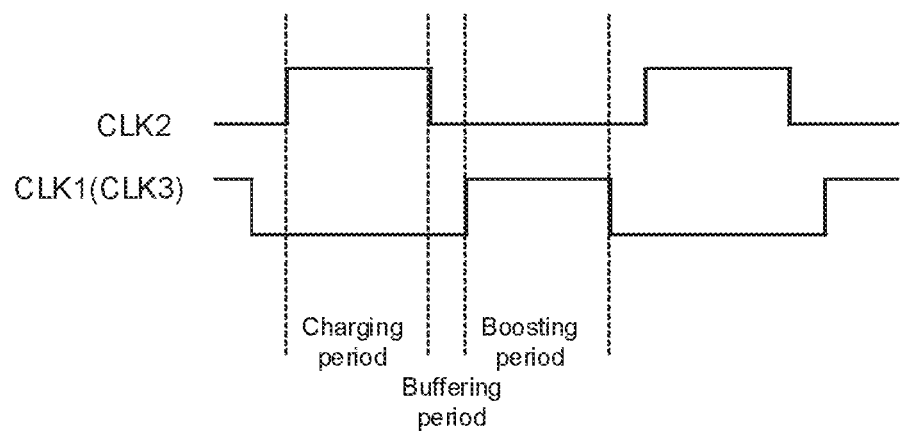
FIG. 10 is a timing diagram of exemplary clock signals used when driving the shift register according to an embodiment of the present disclosure.

FIG. 10 is a timing diagram of exemplary clock signals used when driving the shift register 400 according to an embodiment of the present disclosure. Similar to the third stage t3 discussed above, when the first clock signal of the first clock signal terminal CLK1 is low and the second clock signal of the second clock signal terminal CLK2 is high, the second capacitor C2 is charged, that is, entering the charging period. Next, since the duty cycles of the first clock signal and the second clock signal are less than 50%, there is a buffering period, in which the first clock signal and the second clock signal are both low, between the third phase t3 and the fourth phase t4 described above. During the buffering period, in the embodiment of FIG. 4, since the first clock signal and the second clock signal are both low, the ninth transistor M9, the tenth transistor M10, and the eleventh transistor M11 are turned off. As a result, the second capacitor C2, the pulling-down controlling node PDCN, the pulling-down node PD, and the pulling-up node PU are all maintained at the same state, that is, the second capacitor C2 is still in a charging state, and the outputting signal terminal OUTPUT is still kept in outputting the low level signal.

Next, returning to referring to FIG. 10, when the first clock signal of the first clock signal terminal CLK1 is at the high level and the second clock signal of the second clock signal terminal CLK2 is at the low level, the voltage of the terminal of the second capacitor C2 which is at the side of the pulling-down controlling node PDCN further rises, that is, entering the boosting period. Those skilled in that art would understand that for a clock signal with a duty cycle of less than 50%, the voltage at the pulling-down controlling node PDCN can also be boosted through the above-mentioned shift register, thereby avoiding the splash screen phenomenon.

Hereinafter, a method for driving a shift register according to an embodiment of the present disclosure will be described in detail with reference to FIG. 7.

FIG. 7 is a flowchart illustrating an example method of driving a shift register 400 according to an embodiment of the present disclosure. As shown in FIG. 7, the method 700 may include steps S710, S720, S730, and S740. According to the present disclosure, some steps of the method 700 may be performed individually or in combination, and may be performed in parallel or sequentially, and is not limited to the specific operation sequence shown in FIG. 7. In some embodiments, the method 700 may be implemented by each shift register or another external device described herein.

The method 700 may begin at step S710.

In step S710, in the first stage, the first level is input to the inputting signal terminal, the second level is input to the first clock signal terminal, and the first level is input to the second clock signal terminal, so that the outputting signal terminal outputs the second level.

In step S720, in the second stage, the first level is input to the first clock signal terminal, and the second level is input to the second clock signal terminal, so that the outputting signal terminal outputs the first level.

In step S730, in the third stage, the first level is input to the resetting signal terminal, the second level is input to the first clock signal terminal, and the first level is input to the second clock signal terminal, so that the outputting signal terminal outputs the second level.

In step S740, in the fourth stage, one of the first level and the second level is input to the first clock signal terminal, and the other of the first level and the second level is input to the second clock signal terminal, so that the outputting signal terminal outputs the second level.

With the above-mentioned shift register, the driving method thereof, and the gate driving circuit, the equivalent internal resistance of the transistor such as the sixth transistor M6 can be reduced by increasing the gate-source voltage of the sixth transistor M6 which is controlled by the pulling-down controlling node, thereby increasing the operating voltage margins at some or all of the nodes (for example, pulling-down node), thereby relieving the problem of splash screen caused by an increase in load of the transistor in a high temperature environment. Such a solution has the advantages of an obvious boost effect and a small footprint of circuits.

Figure 8:
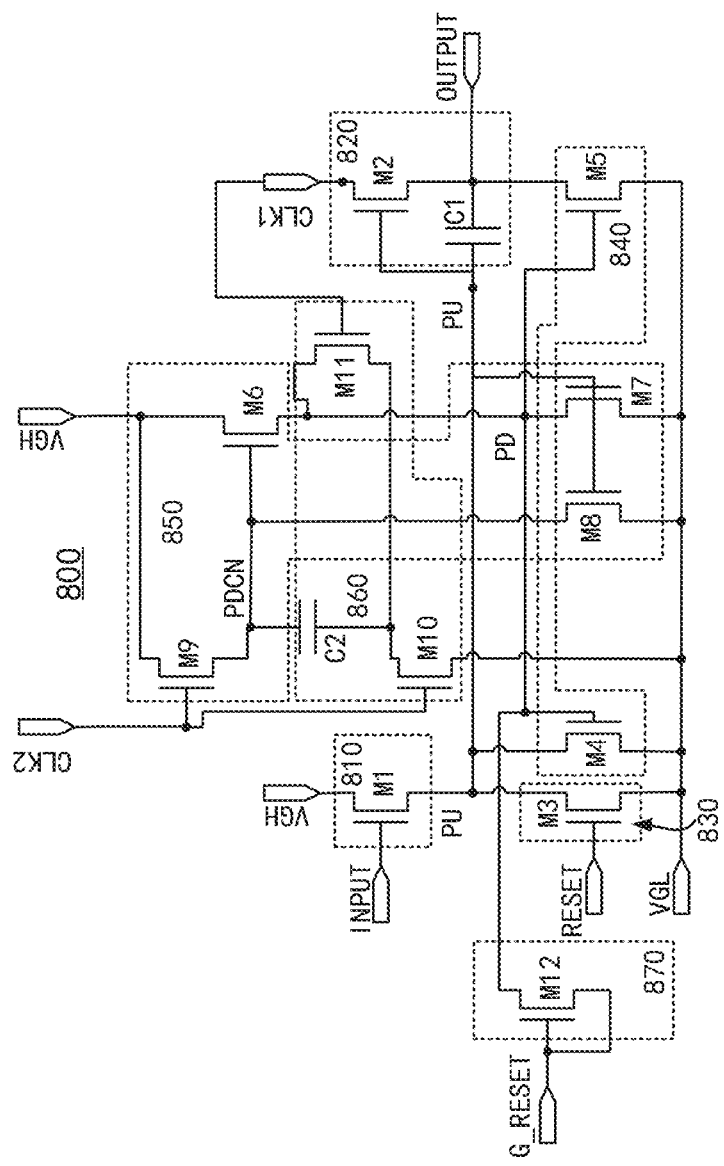
FIG. 8 is a schematic diagram illustrating another exemplary specific configuration of the shift register shown in FIG. 3.

FIG. 8 is a schematic diagram illustrating another exemplary specific configuration 800 of the shift register 300 shown in FIG. 3. As shown in FIG. 8, similar to the shift register 400 shown in FIG. 4, the shift register 800 may include an inputting sub-circuit 810, an outputting sub-circuit 820, a resetting sub-circuit 830, a pulling-down sub-circuit 840, and a pulling-down controlling sub-circuit 850 and a voltage regulating sub-circuit 860. These sub-circuits are similar in function to those in the shift register 400, and a detailed description thereof will be omitted here. In addition, the shift register 800 may further include a global resetting sub-circuit 870.

As shown in FIG. 8, the global resetting sub-circuit 870 may include a twelfth transistor M12 having a controlling electrode and a first electrode coupled to the global resetting signal terminal G_RESET, and a second electrode coupled to the pulling-down node PD. In the embodiment shown in FIG. 8, the global resetting sub-circuit 870 may be configured to transmit a global resetting signal from the global resetting signal terminal G_RESET to the pulling-down node PD, under a control of the global resetting signal, thereby resetting the shift register 800. In some embodiments, the global resetting signal terminal G_RESET may be coupled to the STV line of the gate driving circuit, and configured to reset the shift register 800 under the control of the signal from the STV line.

Figure 9:
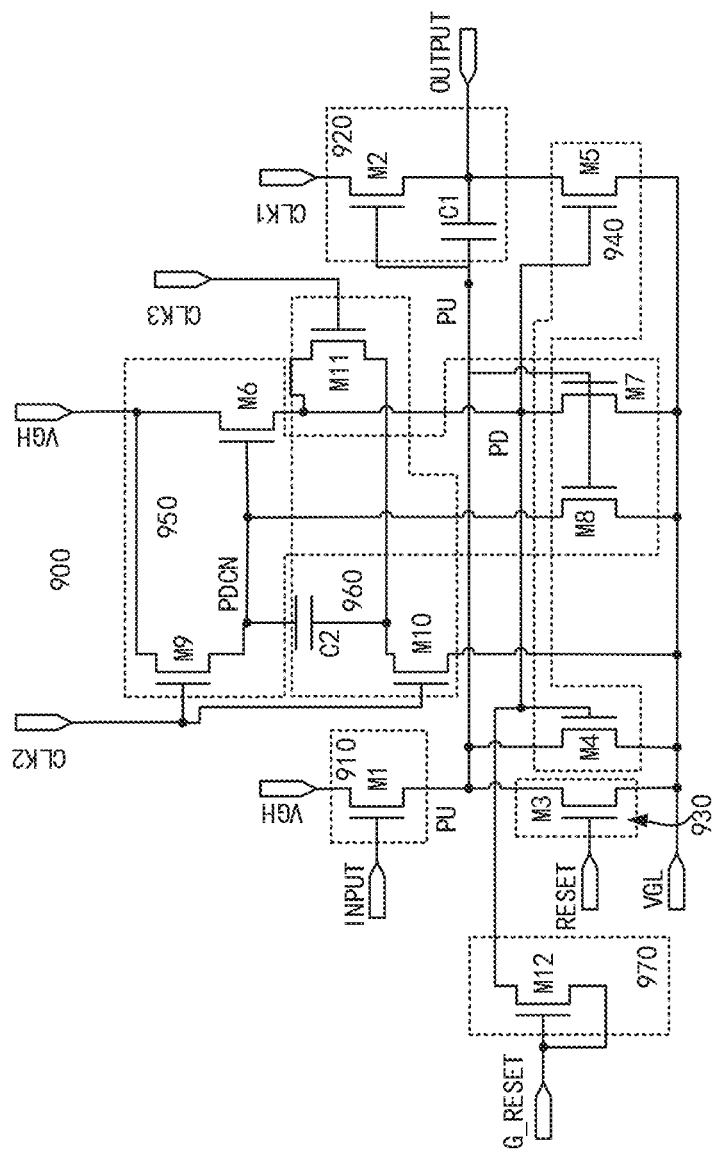
FIG. 9 is a schematic diagram illustrating yet another exemplary specific configuration of the shift register shown in FIG. 3.

FIG. 9 is a schematic diagram illustrating yet another exemplary specific configuration 900 of the shift register 300 shown in FIG. 3 As shown in FIG. 9, similar to the shift register 800 shown in FIG. 8, the shift register 900 may include an inputting sub-circuit 910, an outputting sub-circuit 920, a resetting sub-circuit 930, a pulling-down sub-circuit 940, a pulling-down controlling sub-circuit 950 and a voltage regulating sub-circuit 960. Except for the clock signal input to the ninth transistor M9, the tenth transistor M10, and the eleventh transistor M11, these sub-circuits are similar in function to those in the shift register 800, and a detailed description thereof will be omitted here. In addition, those skilled in the art can understand that although FIG. 9 shows that the shift register 900 may include a global resetting sub-circuit 970, the shift register 900 may also be implemented without the global resetting sub-circuit 970, which is not limited in the embodiment of the present disclosure.

In the embodiment shown in FIG. 9, compared with the second clock signal from the second clock signal terminal CLK2 and the third clock signal from the third clock signal terminal CLK3, the first clock signal from the first clock signal terminal CLK1 may have a lower frequency. In other words, in the embodiments shown in FIGS. 4 and 8, the first clock signal and the second clock signal used herein may be clock signals having the same frequency. In the embodiment shown in FIG. 9, the first clock signal may be a clock signal having a relatively low frequency, and the second clock signal and the third clock signal may be clock signals at the same frequency which is relatively high. In this case, for example, an additional third clock signal line CLK3 may be introduced into the gate driving circuit 500 shown in FIG. 5, wherein a third clock signal from the third clock signal line CLK3 may have the same frequency and an opposite phase compared with the second clock signal, and the frequency of the second clock signal and the third clock signal may be greater than the frequency of the first clock signal. In this case, the first clock signal terminals CLK1 of all the registers in the gate driving circuit are coupled to the first clock signal line CLK1, and the second clock signal terminals CLK2 and the third clock signal terminals CLK3 of adjacent two-stages of registers are respectively coupled to the second clock signal line CLK2 and the third clock signal line CLK3 in sequence, so as to achieve a faster boosting operation at the pulling-down controlling node PDCN.

As described above, by increasing the gate-source voltage of the sixth transistor M6 via for example, adding the aforementioned 2T1C, the gate voltage of the sixth transistor M6 can be enabled to be increased to about 3 times the gate voltage in the example shown in FIG. 1, and the gate-source voltage is enabled to be increased by about 2 times, which can reduce the equivalent internal resistance of the sixth transistor M6 greatly and increase the voltage at the pulling-down node PD. At the same time, the newly added second capacitor C2 does not take up much space compared to the transistor and is easy to implement. For the two added small transistors M10 and M11, the added footprint is also very small, since there is no limitation on the ratio of the channel width of the sixth transistor M6 and the seventh transistor M7.

In addition, in some examples, for example, when the ratio of the aspect ratio of the eighth transistor M8 and the ninth transistor M9 is 1:1, if VGH equals 18V and VGL equals −12V, in the circuit of FIG. 1, under an ideal state, the sixth transistor M6 (that is, the voltage at the pulling-down controlling node PDCN) may have the gate voltage being equal to 18V when the pulling-up node PU is pulled down, and the drain voltage (that is, the voltage at the pulling-down node PD) being charged gradually from 0V. Thus, the initial gate-source voltage is also 18V. By using the shift register according to the embodiment of the present disclosure, the sixth transistor M6 may have the gate voltage equal to 18V when the pulling-up node PU is pulled low, and the drain voltage gradually charged from 0V. Thus, the initial gate-source voltage is also 18V. After the high level of the subsequent second clock signal arrives, the voltages at both terminals of the second capacitor C2 jump to VPDCN−VGL+VGH and VGH, respectively, and the gate voltage of the sixth transistor M6 becomes 48V, thereby enabling the gate source voltage to be 30V. Furthermore, the equivalent internal resistance of the sixth transistor M6 is greatly reduced, increasing the voltage at the PD node effectively, and avoiding the possible splash screen phenomenon.

Figure 11:
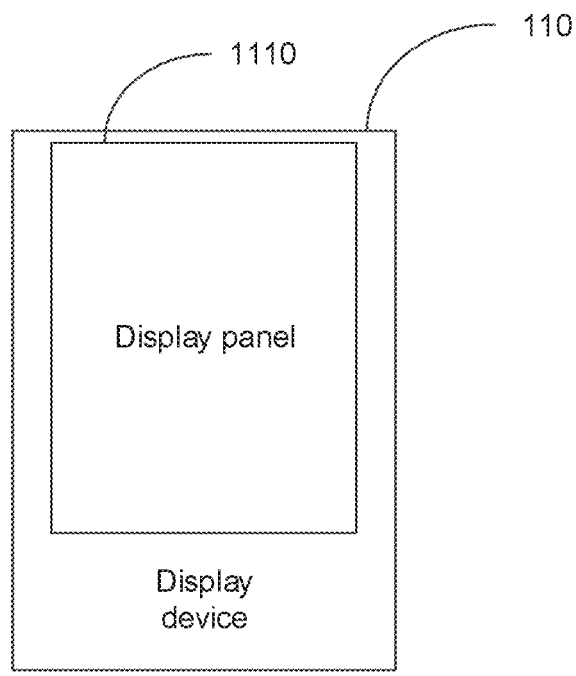
FIG. 11 is a schematic diagram illustrating an exemplary configuration of a display device according to an embodiment of the present disclosure.

According to another aspect of the embodiments of the present disclosure, a display device is also provided. As shown in FIG. 11, the display device 110 may include the gate driving circuit 1110 according to an embodiment of the present disclosure.

It should be noted that the display device in this embodiment may be a display panel, an electronic paper, a mobile phone, a tablet computer, a television, a notebook computer, a digital photo frame, a navigator, or any product or component having a display function.

The disclosure has been described in connection with the preferred embodiments. It should be understood that those skilled in the art can make various other changes, substitutions, and additions without departing from the spirit and scope of the present disclosure. Therefore, the scope of the present disclosure is not limited to the specific embodiments described above, but should be defined by the appended claims.

In addition, the functions described in this description as being implemented by pure hardware, pure software, and/or firmware can also be implemented by means of dedicated hardware, a combination of general-purpose hardware and software and the like. For example, the functions described as being implemented by dedicated hardware (e.g., field programmable gate array (FPGA), application specific integrated circuit (ASIC), etc.) can also be implemented by a combination of general-purpose hardware (e.g., central processing unit (CPU), digital signal processing) (DSP)) and software, and vice versa.

We claim:

1. A shift register, comprising:
an inputting sub-circuit coupled to an inputting signal terminal, a first voltage signal terminal and a pulling-up node, and configured to transmit a first voltage signal from the first voltage signal terminal to the pulling-up node under a control of an inputting signal from the inputting signal terminal;
an outputting sub-circuit coupled to the pulling-up node, a first clock signal terminal, and an outputting signal terminal, and configured to transmit a first clock signal from the first clock signal terminal to the outputting signal terminal under a control of a voltage at the pulling-up node;
a resetting sub-circuit coupled to a resetting signal terminal, a second voltage signal terminal and the pulling-up node, and configured to transmit a second voltage signal from the second voltage signal terminal to the pulling-up node under a control of a resetting signal from the resetting signal terminal;
a pulling-down sub-circuit coupled to a pulling-down node, the second voltage signal terminal, the pulling-up node and the outputting signal terminal, and configured to transmit the second voltage signal to the pulling-up node and the outputting signal terminal respectively, under a control of a voltage at the pulling-down node;
a pulling-down controlling sub-circuit coupled to the pulling-up node, the pulling-down node, a pulling-down controlling node, the first voltage signal terminal, the second voltage signal terminal, and a second clock signal terminal, and configured to transmit the first voltage signal or the second voltage signal to the pulling-down node under a control of the voltage at the pulling-up node, a voltage at the pulling-down controlling node, and a second clock signal from the second clock signal terminal; and
a voltage regulating sub-circuit coupled to the pulling-down node, the pulling-down controlling node, the second clock signal terminal, a third clock signal terminal, the first voltage signal terminal and the second voltage signal terminal, and configured to regulate the voltage at the pulling-down controlling node based on the first voltage signal and the second voltage signal, under the control of the second clock signal, a third clock signal from the third clock signal terminal, and the voltage at the pulling-down node.

2. The shift register of claim 1, wherein the inputting sub-circuit comprises:
a first transistor having a controlling electrode coupled to the inputting signal terminal, a first electrode coupled to the first voltage signal terminal, and a second electrode coupled to the pulling-up node.

3. The shift register of claim 1, wherein the outputting sub-circuit comprises:
a second transistor having a controlling electrode coupled to the pulling-up node, a first electrode coupled to the first clock signal terminal, and a second electrode coupled to the outputting signal terminal; and
a first capacitor having a first terminal coupled to the pulling-up node, and a second terminal coupled to the outputting signal terminal.

4. The shift register of claim 1, wherein the resetting sub-circuit comprises:
a third transistor having a controlling electrode coupled to the resetting signal terminal, a first electrode coupled to the second voltage signal terminal, and a second electrode coupled to the pulling-up node.

5. The shift register of claim 1, wherein the pulling-down sub-circuit comprises:
a fourth transistor having a controlling electrode coupled to the pulling-down node, a first electrode coupled to the second voltage signal terminal, and a second electrode coupled to the pulling-up node; and
a fifth transistor having a controlling electrode coupled to the pulling-down node, a first electrode coupled to the second voltage signal terminal, and a second electrode coupled to the outputting signal terminal.

6. The shift register of claim 5, wherein the pulling-down controlling sub-circuit comprises:
a sixth transistor having a controlling electrode coupled to the pulling-down controlling node, a first electrode coupled to the first voltage signal terminal, and a second electrode coupled to the pulling-down node;
a seventh transistor having a controlling electrode coupled to the pulling-up node, a first electrode coupled to the second voltage signal terminal, and a second electrode coupled to the pulling-down node;
an eighth transistor having a controlling electrode coupled to the pulling-up node, a first electrode coupled to the second voltage signal terminal, and a second electrode coupled to the pulling-down controlling node; and
a ninth transistor having a controlling electrode coupled to the second clock signal terminal, a first electrode coupled to the first voltage signal terminal, and a second electrode coupled to the pulling-down controlling node.

7. The shift register of claim 6, wherein a ratio of an aspect ratio of a channel of the fifth transistor to an aspect ratio of a channel of the sixth transistor is less than 1/5.

8. The shift register of claim 1, wherein the pulling-down controlling sub-circuit comprises:
a sixth transistor having a controlling electrode coupled to the pulling-down controlling node, a first electrode coupled to the first voltage signal terminal, and a second electrode coupled to the pulling-down node;
a seventh transistor having a controlling electrode coupled to the pulling-up node, a first electrode coupled to the second voltage signal terminal, and a second electrode coupled to the pulling-down node;
an eighth transistor having a controlling electrode coupled to the pulling-up node, a first electrode coupled to the second voltage signal terminal, and a second electrode coupled to the pulling-down controlling node; and
a ninth transistor having a controlling electrode coupled to the second clock signal terminal, a first electrode coupled to the first voltage signal terminal, and a second electrode coupled to the pulling-down controlling node.

9. The shift register of claim 1, wherein the voltage regulating sub-circuit comprises:
a second capacitor having a first terminal coupled to the pulling-down controlling node, and a second terminal coupled to a second electrode of a tenth transistor and a second electrode of an eleventh transistor;
the tenth transistor having a controlling electrode coupled to the second clock signal terminal, and a first electrode coupled to the second voltage signal terminal; and
the eleventh transistor having a controlling electrode coupled to the third clock signal terminal, and a first electrode coupled to the pulling-down node.

10. The shift register of claim 1, further comprising:
a global resetting sub-circuit coupled to a global resetting signal terminal and the pulling-down node, and configured to transmit a global resetting signal from the global resetting signal terminal to the pulling-down node, under a control of the global resetting signal.

11. The shift register of claim 10, wherein the global resetting sub-circuit comprises:
a twelfth transistor having a controlling electrode and a first electrode coupled to the global resetting signal terminal, and a second electrode coupled to the pulling-down node.

12. The shift register of claim 10, wherein the inputting sub-circuit, the outputting sub-circuit, the resetting sub-circuit, the pulling-down sub-circuit, the pulling-down controlling sub-circuit, the voltage regulating sub-circuit, and the global resetting sub-circuit all employ N-type transistors, the first voltage signal being a high-level signal, and the second voltage signal being a low-level signal.

13. The shift register of claim 1, wherein the third clock signal is the same as the first clock signal.

14. The shift register of claim 1, wherein the third clock signal has a frequency being equal to the second clock signal but higher than the first clock signal.

15. The shift register of claim 1, wherein at least one of the first clock signal, the second clock signal, or the third clock signal has a duty cycle less than 50%.

16. A gate driving circuit comprising a plurality of cascaded shift registers of claim 1.

17. A display device comprising the gate driving circuit of claim 16.

18. A method for driving the shift register of claim 1, wherein the method comprises:
- inputting, in a first stage, the first level to the inputting signal terminal, the second level to the first clock signal terminal, and the first level to the second clock signal terminal, so that the outputting signal terminal outputs the second level;
- inputting, in a second stage, the first level to the first clock signal terminal, and the second level to the second clock signal terminal, so that the outputting signal terminal outputs the first level;
- inputting, in a third stage, the first level to the resetting signal terminal, the second level to the first clock signal terminal, and the first level to the second clock signal terminal, so that the outputting signal terminal outputs the second level; and
- inputting, in a fourth stage, one of the first level and the second level to the first clock signal terminal, and the other of the first level and the second level to the second clock signal terminal, so that the outputting signal terminal outputs the second level.

* * * * *